(12) United States Patent
Schulz et al.

(10) Patent No.: US 6,768,764 B2
(45) Date of Patent: Jul. 27, 2004

(54) LASER BEAM REFORMING SYSTEM

(75) Inventors: Joachim Schulz, Stuttgart (DE); Holger Schlüter, West Hartford, CT (US)

(73) Assignee: Trumpf Lasertechnik GmbH, Ditzingen (DE)

( * ) Notice: Subject to any disclaimer, the term of this patent is extended or adjusted under 35 U.S.C. 154(b) by 61 days.

(21) Appl. No.: 10/017,089

(22) Filed: Dec. 15, 2001

(65) Prior Publication Data

US 2002/0080845 A1 Jun. 27, 2002

(30) Foreign Application Priority Data

Dec. 16, 2000 (EP) .............................................. 00127604

(51) Int. Cl.[7] .................................................. H01S 3/08
(52) U.S. Cl. ........................................ 372/99; 372/103
(58) Field of Search ................................... 372/99, 103

(56) References Cited

U.S. PATENT DOCUMENTS

| | | | | |
|---|---|---|---|---|
| 3,868,637 A | * | 2/1975 | Schiller | 382/306 |
| 4,886,348 A | | 12/1989 | Schmertz | |
| 5,450,434 A | * | 9/1995 | Ota et al. | 372/57 |
| 5,638,397 A | * | 6/1997 | Nighan et al. | 372/92 |
| 5,646,411 A | * | 7/1997 | Kain et al. | 250/458.1 |
| 6,097,742 A | * | 8/2000 | Caprara et al. | 372/22 |
| 6,183,092 B1 | * | 2/2001 | Troyer | 353/31 |
| 6,285,703 B1 | * | 9/2001 | Schluter | 372/95 |

FOREIGN PATENT DOCUMENTS

| | | |
|---|---|---|
| DE | 4421600 A1 | 1/1996 |
| DE | 44 21 600 | 1/1996 |
| FR | 2414695 | 8/1979 |

OTHER PUBLICATIONS

Optical Testing of Off–Axis Parabolic Segments Without Auxiliary Optical Elements From Optical Engineering, Jan. 1989, vol. 28, No. 1 Aden B. Meinel, Marjorie P. Meinel.

* cited by examiner

Primary Examiner—Don Wong
Assistant Examiner—Delma R. Flores
(74) Attorney, Agent, or Firm—Pepe & Hazard, LLP

(57) ABSTRACT

A system for the reforming of a laser beam having a circular sector shaped beam cross section into a laser beam with a rectangular beam cross section, incorporates a mirror whose surface is shaped as the circular sector of a reflective parabolic rotational body. With only one mirror, and with only minor image aberrations, the circular sector shaped laser beam can be reformed into a rectangular laser beam.

18 Claims, 2 Drawing Sheets

LASER BEAM REFORMING SYSTEM

BACKGROUND OF THE INVENTION

This invention relates to a novel system for the reforming of a laser beam having a circular sector shaped beam cross section by means of a mirror having a reflective surface configured as the circular sector of a rotational body.

The laser beam forming system described in DE 44 21 600 C2 converts a circular sector profiled laser beam with radial and/or azimuthal polarization into a rectangular laser beam with linear polarization. To achieve that effect, the laser beam is shaped by means of a cone sector mirror and a parabolic cylinder mirror, and the line focus of the parabolic cylinder mirror approximately coincides with the axis of rotation of the cone sector mirror. However, this prior art beam forming system requires the use of two mirrors. The cone sector mirror shapes the laser beam in the azimuthal direction; however, for the focussing or defocussing of the laser beam in the radial direction, an additional mirror must be employed. The focal lengths and beam dimensions involved are of an order of magnitude at which, in the case of spherical mirrors, spherical aberrations lead to image distortions.

To permit decoupling of the laser beam from the laser resonator, it is necessary in the case of the prior art beam forming system employing a cone sector mirror for the cone beam angle to deviate slightly deviate from 90° or for the cone axis to deviate somewhat from a precise coincidence with the line focus of the parabolic cylinder mirror. As a result, only approximate rectangularity of the beam cross section and linearity of polarization can be obtained.

Accordingly, it is an objective of the present invention to provide a novel beam reforming system which minimizes image aberrations.

It is also an object to provide a laser including such a laser beam reforming system in which the laser beam is linearly polarized.

SUMMARY OF THE INVENTION

It has now been found that the foregoing objectives may be accomplished by a beam reforming system in which the reflective surface of the mirror is configured as a circular sector of a parabolic rotational body. This reflective surface may be either the convex or the concave surface of a parabolic rotational body, and the parabolic rotational body is preferably in the form of a rotational paraboloid.

A parabolic rotational body is produced by rotating the parabola $z=x^2/a^2<0$ around any given axis of rotation that extends parallel to the axis of symmetry of the parabola. The curvature of the parabola is $d^2z/dx^2=2/a^2$, and, for $a^2>0$, it differs in all cases from zero. A circular sector of a parabolic rotational body could also be approximated by an elliptical rotational body. A rotational paraboloid constitutes a special parabolic rotational body in which the axis of rotation coincides with the axis of symmetry of the parabola.

Reflective surfaces in the form of circular sectors of parabolic rotational bodies shape the laser beam both in the azimuthal and in the radial direction. With mirrors of this type, no image aberrations whatsoever are encountered, and if there is precise parallelism between the axis of the laser beam and the optical axis, there will also be no astigmatic distortions. The circular sector of a parabolic rotational body produces a line focus on its axis of rotation, whereas the circular sector of a rotational paraboloid produces a point focus on its axis of rotation.

When the circular sector of the parabolic rotational body is in a coaxial position with the circular sector axis of the incident laser beam and the circular sector shaped laser beam is reflected at the parabolic rotational body by 90°, the radial and/or azimuthal polarization transitions into a linear polarization. The effective focal length of the circular sector of the parabolic rotational body corresponds in the azimuthal direction to the radius of curvature of the circular-sector-shaped laser beam. Reflection by the parabolic rotational body or by the rotational paraboloid reforms the circular sector shaped laser beam into a rectangular laser beam while the parabolic rotational body mirror produces on its axis of rotation a line focus and the rotational paraboloid mirror produces on its axis of rotation a point focus. Since the optical axis extends parallel to the axis of the laser beam, no astigmatic distortions are generated and image aberrations as a whole are minimized.

It is desirable to provide an aperture (spatial filter) in the line focus of the circular sector of the parabolic rotational body or in the point focus of the circular sector of the rotational paraboloid to filter undesirable diffraction components (secondary maxima) from the rectangular laser beam. The relative position between the filter and the line or point focus of the circular sector may be adjustable. A measuring device can be used to detect the temperature at the filter and to generate a corresponding temperature signal which serves as a control signal for adjusting the adaptive mirror or for moving the aperture.

In preferred embodiments of this invention, an optical element with one or several surfaces is positioned downstream from the circular sector and its surface(s) serves to modify the laser beam in each case so as to extend in two mutually perpendicular directions. This optical element makes it possible at the point of application to form the desired width of the laser beam.

In a variation of this design, the optical element is configured as a single unit bifocal lens whose rearward focus is preferably positioned in the area of the axis of rotation of the parabolic rotational body.

In another embodiment, the optical element is configured as a multi-component device, consisting for instance of a cylindrical lens and a parabolic cylindrical mirror, or of a cylindrical lens and two parabolic cylindrical mirrors. The rearward line focus of the cylindrical lens and/or the rearward line focus of the parabolic cylindrical mirror is/are preferably positioned in the area of axis of rotation of the parabolic rotational body. The cylindrical lens may serve both as a vacuum seal on the laser resonator and as an output window. A parabolic cylindrical mirror may also be approximated by an elliptic-cylindrical mirror.

The circular sector of the parabolic rotational body and the cylindrical lens can jointly constitute a Galilean telescope for what was the radial and is now the deradiused direction of the circular sector shaped laser beam. The circular sector of the parabolic rotational body jointly with a parabolic cylindrical mirror can constitute a Kepler telescope for what was the azimuthal and is now the deradiused direction, and the two parabolic cylindrical mirrors can jointly constitute a Kepler telescope in the original azimuthal direction.

This invention also applies to a laser having a coaxial laser resonator with an annular discharge chamber and a circular sector shaped decoupling, i.e. output opening as well as a system for beam reforming as described above. In this case, the circular sector of the parabolic rotational body is coaxially aligned with the circular sector axis of the incident laser beam, i.e., the axis of rotation of the parabolic rotational body coincides with the circular sector axis of the incident laser beam. This reforms the circular sector shaped laser beam with radial and/or azimuthal polarization into a rectangular laser beam with linear polarization.

BRIEF DESCRIPTION OF THE DRAWINGS

Other advantageous features of this invention will be evident from the following description and from the attached drawings, and the features specified above and those explained hereinafter may be employed individually or in any desired combination. The design and implementation versions depicted or described are not to be viewed as a limiting enumeration but, rather explanatory examples of this invention.

DETAILED DESCRIPTION OF THE INVENTION

Figures 1, 2:
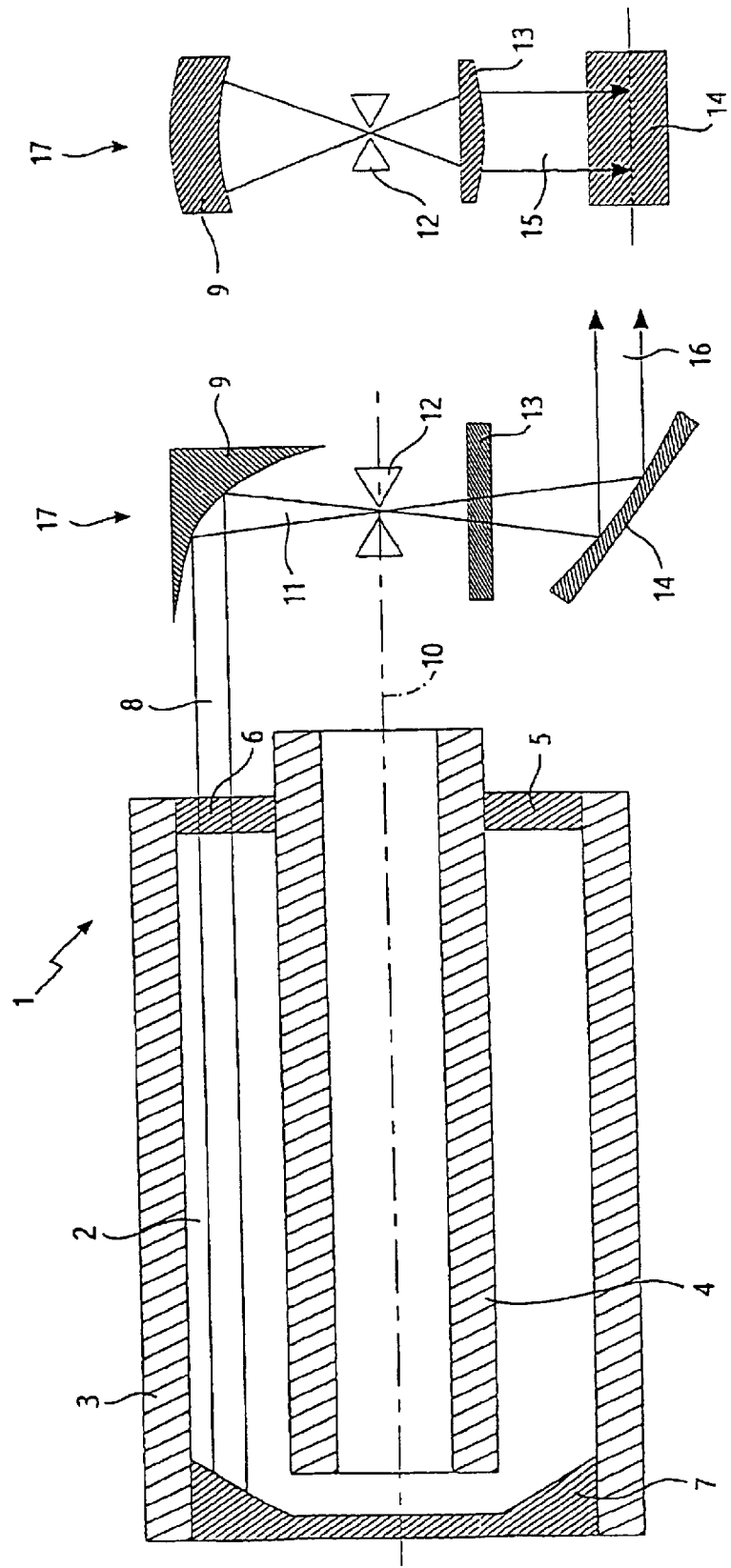
FIG. 1 illustrates a laser with a coaxial laser resonator and a system embodying the present invention for reforming the laser beam.
FIG. 2 is a diagrammatical sectional view, not to scale, of the illustrated beam reforming system in FIG. 1.

FIG. 1 shows a coaxial laser resonator 1 with an annular discharge chamber 2 having a cylindrical outer electrode 3 and enclosed therein, a coaxial cylindrical inner electrode 4. At the right end of the laser resonator 1 in FIG. 1, the ring-shaped discharge chamber 2 is closed by a circular front mirror 5 with a circular sector shaped output opening 6, and at the left end by a conical retromirror 7.

The laser beam 8 that exits from the annular discharge chamber 2 through the circular sector shaped output opening 6 is radially and/or azimuthally polarized. Moreover, the power density distribution includes undesirable diffraction components (secondary maxima).

On the inside of the laser discharge chamber 2, the circular sector shaped laser beam 8 impinges on a 90° deflecting circular sector 9 of a rotational paraboloid mirror whose axis of rotation 10 extends in a direction that is coaxial with the annular discharge chamber 2 and parallel to the direction of incidence of the laser beam 8. Its focal length in the azimuthal direction corresponds to the radius of curvature of the circular sector shaped cross section of the laser beam 8. The reflection of the circular sector shaped laser beam 8 by the circular sector 9 of the rotational paraboloid reforms it into a rectangular (i.e., deradiused) laser beam 11 and its focus point is on the axis of rotation 10. Positioned in the area of this focus point is an aperture 12, in particular a nozzle-type filter, which screens undesirable diffraction components out of the rectangular laser beam 11.

In order for the rectangular laser beam 11 to be of the desired beam width in both directions at the point of its application, a cylindrical lens 13 is interposed for beam reforming in what was originally the azimuthal direction, and a parabolic cylindrical mirror 14, which may also be approximated by an elliptic cylindrical mirror, is interposed for beam reforming in what was originally the radial direction. The rectangular laser beam 11 impinges on the cylindrical lens 13 which has no effect on the originally radial direction of the rectangular laser beam 11 but it produces a parallel laser beam 15 in the originally azimuthal direction as seen in FIG. 2. The parabolic cylindrical mirror 14 is so placed in the beam path that its rearward line focus is essentially positioned in the area of the axis of rotation 10. Appropriate selection of the focal length for the parabolic cylindrical mirror 14 produces a radially parallel laser beam 16 of the desired radial beam width.

The circular sector 9, the aperture 12, the cylindrical lens 13 and the parabolic cylindrical mirror 14 together make up the beam reforming system 17.

Figures 3, 4:
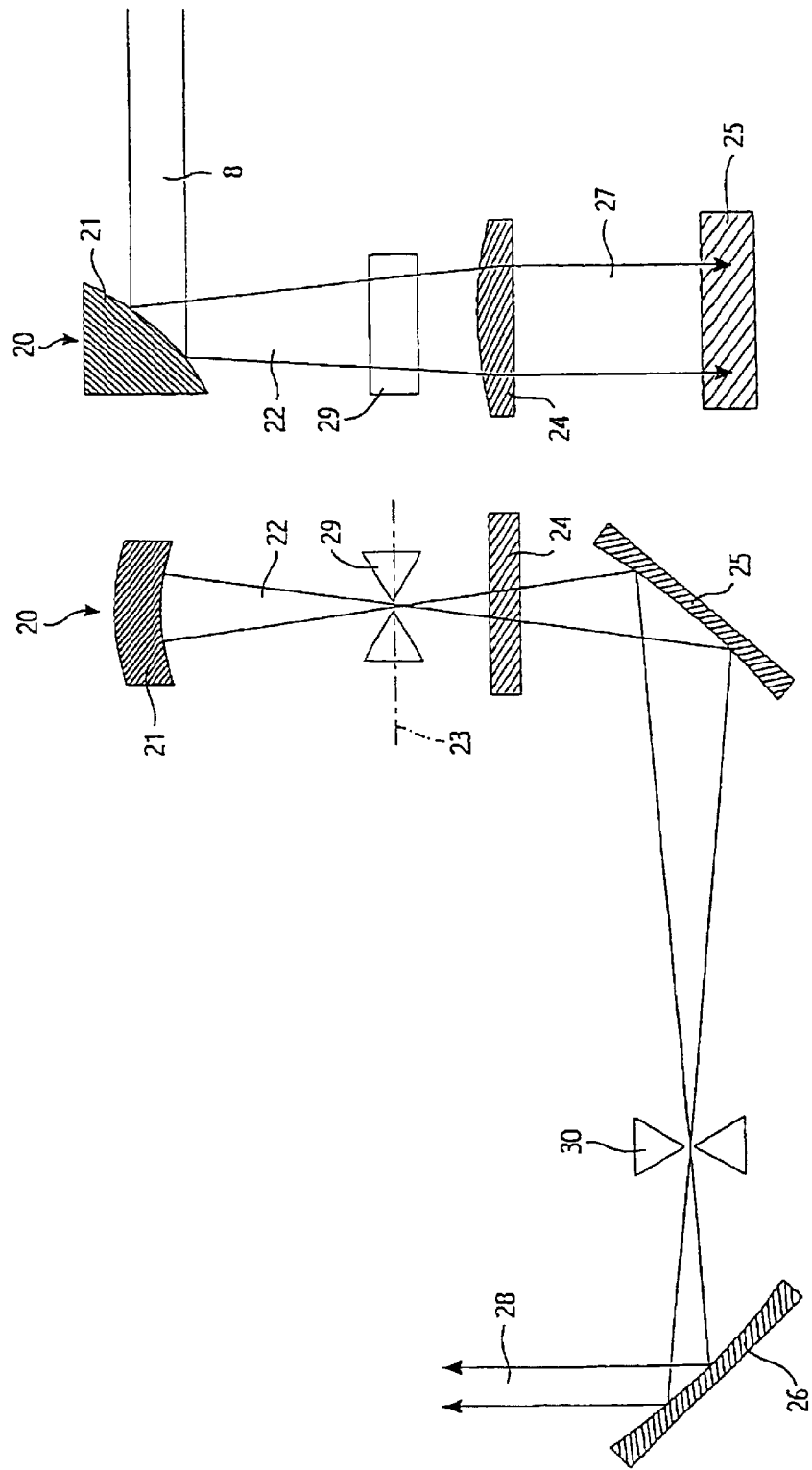
FIG. 3 depicts, in a diagrammatical illustration corresponding to that in FIG. 1, another system embodying this invention for reforming the laser beam.
FIG. 4 is a diagrammatical sectional view, not to scale, corresponding to the presentation in FIG. 2, of the beam reforming system illustrated in FIG. 3.

Illustrated in FIG. 3 and FIG. 4 is a different beam reforming system 20 in which the circular sector shaped laser beam 8 impinges on the outside of the circular sector 21 of a parabolic rotational body. The reflection by the convex outer surface of the circular sector 21 reforms the circular sector shaped laser beam into a rectangular laser beam 22 and a line focus is produced on the axis of rotation 23 of the parabolic rotational body.

In order for the rectangular laser beam 22 to be of the desired beam width in both directions at the point of its application, a cylindrical lens 24 is interposed for beam reforming in what was originally the radial direction while two parabolic cylindrical mirrors 25, 26 are interposed for beam reforming in what was originally the azimuthal direction. The circular sector 21 of the parabolic rotational body mirror, jointly with the cylindrical lens 24, constitute a Galilean telescope which generates a parallel laser beam 27 in the originally radial direction, and jointly with the first parabolic cylindrical mirror 25 constitute a Kepler telescope.

The two parabolic cylindrical mirrors 25, 26 jointly constitute another Kepler telescope for the originally azimuthal direction, producing a parallel laser beam 28 in what was originally the azimuthal direction. The rectangular laser beam 22 impinges on the cylindrical lens 24 which is so placed in the beam path that its rearward line focus is essentially positioned in the area of the axis of rotation 23. Suitable selection of the focal length of the cylindrical lens 24 produces a laser beam 27 with a beam width as desired in the originally radial direction as shown in FIG. 4. The other, originally azimuthal direction of the laser beam 22 is not affected by the cylindrical lens 24. The laser beam 27 then impinges on the parabolic cylindrical mirror 25 which in turn does not affect the originally radial direction of the laser beam 22.

For filtering diffraction components from the laser beam 22, a filter 29 may be positioned in the area of the line focus of the circular sector 21 of the parabolic rotational body, or an aperture 30 may be positioned in the area of the line focus of the first parabolic cylindrical mirror 25.

Thus, it can be seen that a system 17 for the reforming of a laser beam 8 with a circular sector shaped beam cross section into a laser beam 11 with a rectangular beam cross section utilizes a mirror whose surface is shaped as a circular sector 9 of a reflective parabolic rotational body. It is thus possible with only a single mirror to reform the circular sector shaped laser beam 8 into a rectangular laser beam 11 with only minor image aberrations.

Having thus described the invention, what is claimed is:

1. A laser beam generating assembly comprising a coaxial laser resonator generating a circular sector shaped beam cross section with azimuthal polarization and an optical beam reforming system through which the lower beam extends in a beam path including a mirror with a reflective surface shaped in the form of a circular sector of a parabolic rotational body, said beam reforming system reforming the circular sector shaped laser beam into one having a rectangular cross section with linear polarization.

2. The coaxial laser beam generating assembly in accordance with claim 1, wherein said reflective surface is the convex or concave surface of a parabolic rotational body.

3. The coaxial laser beam generating assembly in accordance with claim 2, wherein such parabolic rotational body is in the form of a rotational paraboloid.

4. The coaxial laser beam generating assembly in accordance with claim 2, wherein said optical system includes a filter positioned in the line focus of the circular sector of the parabolic rotational body.

5. The coaxial laser beam generating assembly in accordance with claim 3, wherein said optical beam reforming system includes a filter positioned in the point focus of the circular sector of the rotational paraboloid.

6. The coaxial laser beam generating assembly in accordance with claim 1, wherein said optical system includes an optical element interposed in the beam path after the beam has been reformed by said mirror, said optical element having at least one surface serving to reform the laser beam in two mutually perpendicular directions.

7. The coaxial laser beam generating assembly in accordance with claim 6, wherein said optical element is a bifocal lens.

8. The coaxial laser beam generating assembly in accordance with claim 6, wherein said optical element consists of several components.

9. The coaxial laser beam generating assembly in accordance with claim 8, in which said components of said optical element comprise a cylindrical lens and at least one parabolic cylindrical mirror.

10. In combination,
(a) a coaxial laser resonator with an annular discharge chamber and a circular sector shaped output opening generating a laser beam with a circular sector shaped beam cross section and azimuthal polarization; and
(b) an optical beam reforming system providing a beam path therethrough and including a mirror with a reflective surface shaped in the form of a circular sector of a parabolic rotational body, said optical system reforming the laser beam into a laser beam with a rectangular beam cross section and linear polarization.

11. The combination of a laser resonator and optical beam reforming system in accordance with claim 10 wherein said circular sector of said parabolic rotational body is coaxially aligned with the circular sector axis of the laser beam incident thereon.

12. The combination of a laser resonator and optical beam reforming system in accordance with claim 10 wherein said reflective surface is the convex or concave surface of a parabolic rotational body, and wherein such parabolic rotational body is in the form of a rotational paraboloid.

13. The combination of a laser resonator and optical beam resonator system in accordance with claim 10 wherein said optical system includes an optical element interposed in the beam path after the beam has been reformed by said mirror, said optical element having at least one surface serving to reform the laser beam in two mutually perpendicular directions.

14. The combination of a laser resonator and optical beam resonator system in accordance with claim 13 wherein said optical element is a bifocal lens.

15. The combination of a laser resonator and optical beam resonator system in accordance with claim 13 wherein said optical element consists of several components.

16. The combination of a laser resonator and optical beam resonator system in accordance with claim 13 in which said components of said optical element comprise a cylindrical lens and at least one parabolic cylindrical mirror.

17. The combination of a laser resonator and optical beam resonator system in accordance with claim 10 wherein said optical system includes a filter positioned in the line focus of the circular sector of the parabolic rotational body.

18. The combination of a laser resonator and optical beam resonator system in accordance with claim 10 wherein said optical system includes a filter positioned in the point focus of the circular sector of the rotational paraboloid.

* * * * *